(12) United States Patent
Eslamy et al.

(10) Patent No.: US 7,578,057 B2
(45) Date of Patent: Aug. 25, 2009

(54) METHOD OF FABRICATING SEGMENTED CONTACTOR

(75) Inventors: Mohammad Eslamy, San Jose, CA (US); David V. Pedersen, Scotts Valley, CA (US); Harry D. Cobb, Ripon, CA (US)

(73) Assignee: FormFactor, Inc., Livermore, CA (US)

( * ) Notice: Subject to any disclaimer, the term of this patent is extended or adjusted under 35 U.S.C. 154(b) by 59 days.

(21) Appl. No.: 11/426,621

(22) Filed: Jun. 27, 2006

(65) Prior Publication Data

US 2006/0244469 A1 Nov. 2, 2006

Related U.S. Application Data

(62) Division of application No. 10/667,689, filed on Sep. 22, 2003, now Pat. No. 7,065,870, which is a division of application No. 10/202,971, filed on Jul. 25, 2002, now Pat. No. 6,640,415, which is a division of application No. 09/327,116, filed on Jun. 7, 1999, now Pat. No. 7,215,131.

(51) Int. Cl.
*H01R 9/00* (2006.01)

(52) U.S. Cl. ............................ 29/842; 29/843; 29/855; 228/179.1; 228/180.21

(58) Field of Classification Search .................. 29/840, 29/843, 855, 842; 228/179, 180.21
See application file for complete search history.

(56) References Cited

U.S. PATENT DOCUMENTS

| | | | |
|---|---|---|---|
| 3,379,937 A | 4/1968 | Shepherd et al. |
| 3,702,982 A | 11/1972 | Kelley et al. |
| 3,781,683 A | 12/1973 | Freed |
| 3,787,768 A | 1/1974 | Kubota et al. |
| 3,849,728 A | 11/1974 | Evans |
| 3,963,986 A | 6/1976 | Morton et al. |
| 3,973,091 A | 8/1976 | Kaminski |
| 4,032,058 A | 6/1977 | Riseman |
| 4,087,747 A | 5/1978 | Deegen et al. |
| 4,357,062 A | 11/1982 | Everett |
| 4,508,405 A | 4/1985 | Damon et al. |
| 4,522,893 A | 6/1985 | Bohlen et al. |
| 4,528,500 A | 7/1985 | Lightbody et al. |

(Continued)

FOREIGN PATENT DOCUMENTS

DE 4237591 11/1994

(Continued)

OTHER PUBLICATIONS

U.S. Appl. No. 09/327,116, filed Jun. 7, 1999, Eslamy.

(Continued)

*Primary Examiner*—C. J Arbes
(74) *Attorney, Agent, or Firm*—N. Kenneth Burraston

(57) ABSTRACT

A method of fabricating a large area, multi-element contactor. A segmented contactor is provided for testing semiconductor devices on a wafer that comprises a plurality of contactor units mounted to a substrate. The contactor units are formed, tested, and assembled to a backing substrate. The contactor units may include leads extending laterally for connection to an external instrument such as a burn-in board. The contactor units include conductive areas such as pads that are placed into contact with conductive terminals on devices under test.

14 Claims, 8 Drawing Sheets

U.S. PATENT DOCUMENTS

| | | | |
|---|---|---|---|
| 4,553,192 A | 11/1985 | Babuka et al. | |
| 4,565,314 A | 1/1986 | Scholz | |
| 4,636,722 A | 1/1987 | Ardezzone | |
| 4,724,383 A | 2/1988 | Hart | |
| 4,740,410 A | 4/1988 | Muller et al. | |
| 4,811,081 A | 3/1989 | Lyden | |
| 4,837,622 A | 6/1989 | Whann et al. | |
| 4,899,099 A | 2/1990 | Mendenhall et al. | |
| 4,899,106 A | 2/1990 | Ogura | |
| 4,918,032 A | 4/1990 | Jain et al. | |
| 4,953,834 A | 9/1990 | Ebert et al. | |
| 4,965,865 A | 10/1990 | Trenary | |
| 4,972,580 A | 11/1990 | Nakamura | |
| 4,983,907 A | 1/1991 | Crowley | |
| 4,998,885 A | 3/1991 | Beaman | |
| 5,172,050 A | 12/1992 | Swapp | |
| 5,175,491 A | 12/1992 | Ewers | |
| 5,187,020 A | 2/1993 | Kwon et al. | |
| 5,191,708 A | 3/1993 | Kasukabe et al. | |
| 5,210,939 A | 5/1993 | Mallik et al. | |
| 5,225,777 A | 7/1993 | Bross et al. | |
| 5,236,118 A | 8/1993 | Bower et al. | |
| 5,276,395 A | 1/1994 | Malloy | |
| 5,278,442 A | 1/1994 | Prinz et al. | |
| 5,311,405 A | 5/1994 | Tribbey et al. | |
| 5,312,456 A | 5/1994 | Reed et al. | |
| 5,373,627 A | 12/1994 | Grebe | |
| 5,393,375 A | 2/1995 | MacDonald et al. | |
| 5,395,253 A | 3/1995 | Crumly | |
| 5,418,471 A | 5/1995 | Kardos | |
| 5,422,574 A | 6/1995 | Kister | |
| 5,440,231 A | 8/1995 | Sugai | |
| 5,473,510 A | 12/1995 | Dozier, II | |
| 5,476,211 A | 12/1995 | Khandros | |
| 5,476,818 A | 12/1995 | Yanof et al. | |
| 5,477,160 A | 12/1995 | Love | |
| 5,495,667 A | 3/1996 | Farnworth et al. | |
| 5,534,784 A | 7/1996 | Lum | |
| 5,555,422 A | 9/1996 | Nakano | |
| 5,569,272 A | 10/1996 | Reed | |
| 5,576,630 A | 11/1996 | Fujita | |
| 5,593,322 A | 1/1997 | Swamy et al. | |
| 5,601,740 A | 2/1997 | Eldridge et al. | |
| 5,657,207 A | 8/1997 | Schreiber et al. | |
| 5,691,650 A | 11/1997 | Sugai | |
| 5,741,144 A | 4/1998 | Elco et al. | |
| 5,772,451 A | 6/1998 | Dozier, II et al. | |
| 5,786,701 A | 7/1998 | Pedder | |
| 5,806,181 A | 9/1998 | Khandros et al. | |
| 5,821,763 A | 10/1998 | Beaman et al. | |
| 5,829,128 A * | 11/1998 | Eldridge et al. | 29/855 |
| 5,832,601 A * | 11/1998 | Eldridge et al. | 29/843 |
| 5,864,946 A * | 2/1999 | Eldridge et al. | 29/843 |
| 5,914,614 A | 6/1999 | Beaman et al. | |
| 5,917,707 A | 6/1999 | Khandros et al. | |
| 5,920,200 A | 7/1999 | Pendse et al. | |
| 5,923,178 A | 7/1999 | Higgins et al. | |
| 5,974,662 A | 11/1999 | Eldridge et al. | |
| 5,994,152 A | 11/1999 | Khandros et al. | |
| 5,998,864 A | 12/1999 | Khandros et al. | |
| 6,008,543 A | 12/1999 | Iwabuchi | |
| 6,029,344 A | 2/2000 | Khandros et al. | |
| 6,032,356 A * | 3/2000 | Eldridge et al. | 29/843 |
| 6,050,829 A * | 4/2000 | Eldridge et al. | 439/67 |
| 6,053,395 A | 4/2000 | Sasaki | |
| 6,064,213 A | 5/2000 | Khandros et al. | |
| 6,091,252 A | 7/2000 | Akram et al. | |
| 6,110,824 A | 8/2000 | Eldridge et al. | |
| 6,174,744 B1 | 1/2001 | Watanabe et al. | |
| 6,184,053 B1 | 2/2001 | Eldridge et al. | |
| 6,229,324 B1 | 5/2001 | Akram et al. | |
| 6,287,878 B1 * | 9/2001 | Maeng et al. | 438/15 |
| 6,336,269 B1 | 1/2002 | Eldridge et al. | |
| 6,615,485 B2 * | 9/2003 | Eldridge et al. | 29/843 |
| 6,640,415 B2 * | 11/2003 | Eslamy et al. | 29/593 |
| 6,655,023 B1 * | 12/2003 | Eldridge et al. | 29/843 |
| 6,690,185 B1 | 2/2004 | Khandros et al. | |
| 6,741,085 B1 | 5/2004 | Khandros et al. | |
| 6,838,893 B2 | 1/2005 | Khandros et al. | |
| 7,064,566 B2 * | 6/2006 | Khandros et al. | 324/754 |
| 7,065,870 B2 | 6/2006 | Eslamy | |
| 7,086,149 B2 * | 8/2006 | Eldridge et al. | 29/876 |
| 2001/0054905 A1 | 12/2001 | Khandros et al. | |
| 2002/0053734 A1 * | 5/2002 | Eldridge et al. | 257/724 |
| 2003/0192176 A1 | 10/2003 | Eldridge et al. | |
| 2004/0016119 A1 | 1/2004 | Eldridge et al. | |
| 2004/0163252 A1 | 8/2004 | Khandros et al. | |
| 2005/0035347 A1 | 2/2005 | Khandros et al. | |
| 2007/0046313 A1 * | 3/2007 | Eldridge et al. | 324/765 |

FOREIGN PATENT DOCUMENTS

| | | |
|---|---|---|
| DE | 19610123 | 10/1997 |
| EP | 61615 | 10/1982 |
| EP | 369112 | 5/1990 |
| EP | 460822 | 12/1991 |
| JP | 54-146581 | 11/1979 |
| JP | 63-268285 | 11/1988 |
| JP | 2144869 | 6/1990 |
| JP | 6265575 | 9/1994 |
| JP | 07134161 A * | 5/1995 |
| KR | 1999-0021892 | 3/1999 |
| WO | WO 91/12706 | 8/1991 |
| WO | WO 96/15458 | 5/1996 |
| WO | WO 96/38858 | 12/1996 |
| WO | WO 97/43653 | 11/1997 |
| WO | WO 97/43656 | 11/1997 |
| WO | WO 98/21597 | 5/1998 |

OTHER PUBLICATIONS

Burbank et al, "Automatic Test Equipment Translator Board", IBM Technical Disclosure Bulletin, vol. 21, No. 4, pp. 1404-1405, Sep. 1997.

Emsworth, "High Density Probe Assembly", Research Disclosure 2244, No. 333, p. 33391, Jan. 1993.

Humenik, "Flexible Probe Contact", IBM Technical Brochure, vol. 22, No. 6, p. 2286, (Nov. 1979).

Renz, U., "Multipoint Test Probe for Printed Cards", IBM Technical Disclosure Bulletin, vol. 17, No. 2, pp. 459-460, Jul. 1974.

Renz, U., "Test Probe Contact Grid Translator Board", IBM Technical Disclosure Bulletin, vol. 21, No. 8, pp. 3235-3236, Jan. 1979.

Soejima et al., "New Probe Microstructure For Full-Wafer Contact Prove Cards," 1999 Electronic Components and Technology Conference (1999 IEEE), pp. 1-6.

* cited by examiner

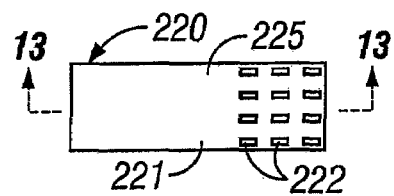
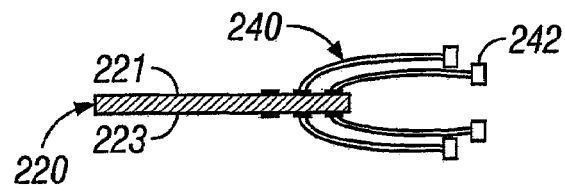
FIG. 12      FIG. 13
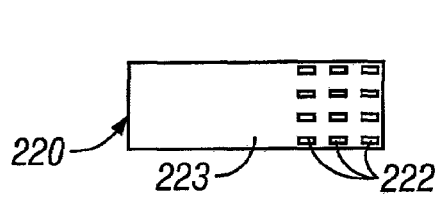
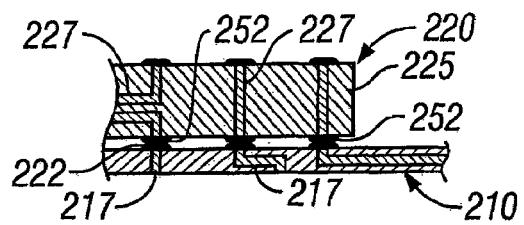
FIG. 14      FIG. 15
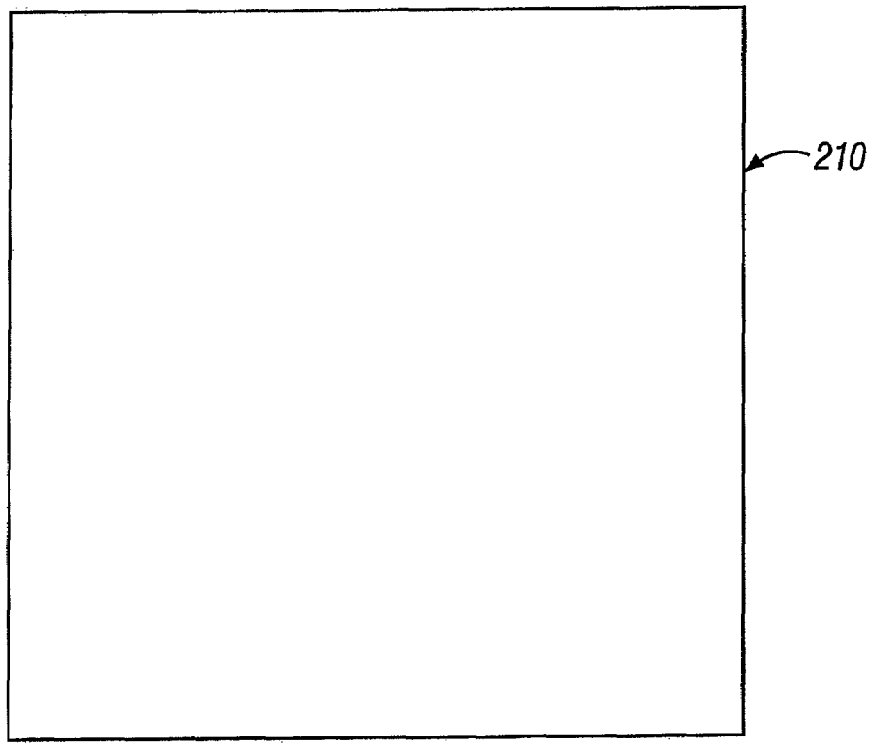
FIG. 16

METHOD OF FABRICATING SEGMENTED CONTACTOR

CROSS-REFERENCE TO RELATED APPLICATIONS

This application is a divisional of patent application Ser. No. 10/667,689 filed Sep. 22, 2003, which is a divisional of U.S. patent application Ser. No. 10/202,971, filed Jul. 25, 2002 (now U.S. Pat. No. 6,640,415), which is a divisional of U.S. patent application Ser. No. 09/327,116, filed Jun. 7, 1999.

FIELD OF THE INVENTION

The present invention relates generally to a method of fabricating a large area multi-element contactor and, more particularly, to a segmented contactor fabricated by mounting multiple contactor units on a substrate.

BACKGROUND OF THE INVENTION

Semiconductor devices (such as integrated circuits) are generally fabricated on a substrate of silicon known as a wafer. A single wafer typically includes a large number of devices (such as integrated circuits) that are grouped into units called dies. A single wafer typically has a plurality of dies formed thereon. Each die is later singulated from the wafer and further processed and packaged. Modern technology typically uses 8-inch (200-mm) diameter wafers, and is moving to 12-inch (300-mm) wafers. Essentially every single device fabricated on a wafer needs to be electrically tested by probing. Probing more than one device at a time is particularly advantageous. Modern probing equipment can probe 32 or more semiconductor devices at the same time. However, this is often only a small fraction of the total number of devices on a wafer. There has been great interest in developing a probing system that can contact more, preferably all devices on a wafer at the same time.

It is generally desirable to identify which of the plurality of dies on a wafer are good prior to their packaging, and preferably prior to their being singulated from the wafer. To this end, a wafer "tester" or "prober" may be employed to make a plurality of discrete pressure connections to a like plurality of discrete connection pads (bond pads) on the dies. In this manner, the semiconductor dies can be tested, prior to singulating the dies from the wafer.

Typically, semiconductor devices are exercised (burned-in and tested) only after they have been singulated (separated) from the wafer and have gone through another long series of "back-end" process steps in which they are assembled into their final "packaged" form. The added time and expense of singulating and packaging the device goes to waste if the final "packaged" device is found to be defective after packaging. Consequently, performing testing or burn-in of semiconductor devices prior to their being singulated from the wafer has been the object of prolonged endeavor.

Modern integrated circuits include many thousands of transistor elements, for example, with many hundreds of bond pads disposed in close proximity to one another; e.g., 4 mils (about 100µ) center-to-center. One common layout of the bond pads has one or more rows of bond pads disposed close to the peripheral edges of the die. Another common layout has is called "lead on center" (LOC) with typically a single row of contacts along a center line of a die. Other layouts, some irregular, are not uncommon. The proximity and number of pads is a challenge to the technology of probing devices.

Generally, probing devices for testing semiconductor devices on a wafer have involved providing a single test substrate with a plurality of contact elements for contacting corresponding pads on the wafer being tested. To test a full wafer simultaneously generally requires extremely complex interconnection substrates, which may easily include tens of thousands of such contact elements. As an example, an 8-inch wafer may contain 500 16 Mb DRAMs, each having 60 bond pads, for a total of 30,000 connections between the wafer under test (WUT) and the test electronics. Earlier solutions included mating with some subset of these connections to support limited or specialized testing. It would be advantageous to fully connect an entire wafer.

Moreover, the fine pitch requirements of modern semiconductor devices require extremely high tolerances to be maintained when bringing the test substrate together with the wafer being tested. During testing or burn-in processes, heat is produced which causes thermal expansion of the underlying substrate materials. Thermal expansion presents a further challenge to connecting a test substrate to the WUT because of the extremely tight tolerances and close spacing of pads.

To effect reliable pressure connections between contact elements and, e.g., a semiconductor device, one must be concerned with several parameters including, but not limited to: alignment, probe force, overdrive, contact force, balanced contact force, scrub, contact resistance, and planarization. A general discussion of these parameters may be found in U.S. Pat. No. 4,837,622, entitled "High Density Probe Card," incorporated by reference herein, which discloses a high density epoxy ring probe card including a unitary printed circuit board having a central opening adapted to receive a preformed epoxy ring array of probe elements.

A more sophisticated probe card uses resilient spring elements to make contact with a device on a wafer. Commonly assigned U.S. Pat. No. 5,806,181, entitled "Contact Carriers for Populating Larger Substrates with Spring Contacts," issued Sep. 15, 1998, ('181 patent), incorporated by reference herein, discloses such a probe card. The resilient spring elements of the '181 patent are pre-fabricated on individual spring contact carriers ("tiles").

The resilient spring elements can alternatively be prefabricated on the wafer itself. This configuration is known as MOST Technology, using Microspring Contacts On Silicon. Such a wafer is conveniently manufactured using techniques described in commonly assigned, copending U.S. patent application Ser. No. 08/558,332, entitled "Method of Mounting Resilient Contact Structures to Semiconductor Devices," filed Nov. 15, 1995, incorporated by reference herein. A contactor or testing substrate that can perform a wafer-level test or burn-in procedure on a MOST wafer must provide corresponding conductive areas that can precisely align with the thousands of microsprings disposed on the wafer.

Providing a contactor that can be precisely aligned with each of the resilient spring elements or bond pads is challenging because of tolerances and the expansion of the underlying substrate materials due to heat produced during the testing or burn-in processes. Also, providing a large size contactor that has corresponding conductive areas for each spring element on the wafer under test can be problematic because if one of the thousands of conductive areas is defective, the entire contactor will be deemed defective.

Thus, what is needed is a segmented contactor that provides separate contactor units for performing wafer-level testing or burn-in procedures and that minimizes problems related to tolerances and thermal expansion.

SUMMARY OF THE INVENTION

In one example of the present invention, a segmented contactor comprises a relatively large backing substrate and at least one relatively small contactor unit ("tile") mounted to the backing substrate. Preferably, a plurality of contactor units is provided. The contactor units are disposed on the front (facing the WUT or other device) surface of the backing (support) substrate. It is also possible (and may be preferable) that one contactor unit is bigger than an individual device under test (DUT) and "mates" with two or more DUTs.

The contactor units can include active semiconductor devices, such as application-specific integrated circuits (ASICs). For example, the ASIC can enable the number of signals being provided to the test substrate from an outside source (e.g., a host controller) to be minimized.

In one example of the invention, resilient contact elements that provide the conductive pressure connections are preferably mounted by their bases directly to the WUT (i.e., to the DUTs on the WUT) so as to have free ends extending to a common plane above the surface of the WUT. The segmented contactor of the present invention preferably has a coefficient of thermal expansion which is well-matched with that of the WUT. Alternatively, the resilient (or spring) contact elements are mounted to the contactor units of the segmented contactor.

An example of a method of fabricating a segmented contactor is provided wherein a plurality of contactor units is mounted on a backing substrate such that resilient contact elements attached to a device on a silicon wafer can be aligned with a plurality of conductive contact areas on each contactor unit during testing.

An exemplary method includes forming a plurality of contactor units on a single contactor substrate, testing electrically each of the contactor units, separating each of the contactor units from the single contactor substrate, and assembling the contactor units which have passed the electrical testing to form the segmented contactor.

Preferably, the contactor units are tested before being separated from the single contactor substrate onto which they are formed. Alternatively, the contactor units can be tested individually after being separated.

Also, each contactor unit preferably includes a plurality of electrically conductive leads extending horizontally beyond an edge of each contactor unit. The plurality of leads is preferably in the form of a flex strip which can have a connector attached to the leads for connecting the contactor unit to an external testing device.

Assembling the contactor units to form the segmented contactor can include providing an assembly fixture for holding the contactor units during the assembly. An example of an assembly fixture is a plate that defines holding spaces. A contactor unit is placed into a corresponding holding space on the plate. Each contactor unit has a first side and a second side. An adhesive or attachment means can be provided on the second side either before or after the contactor unit is placed within its respective holding space on the plate. After the contactor units are placed into respective holding spaces, a backing substrate is pressed onto the adhesive to mount the contactor units to the backing substrate. The backing substrate is then lifted away from the plate. The contactor units are thus properly aligned and mounted to the backing substrate.

The assembly fixture provided for the assembly of the segmented contactor is preferably a flat plate that includes grooves into which guide blocks are placed to define the holding spaces between the guide blocks. The guide blocks provide the proper relative alignment of each contactor unit.

The method and apparatus of an example of the present invention also provide that the first sides of the contactor units are substantially coplanar when mounted onto the backing substrate.

The contactor units can be removably mounted to the backing substrate, such that each contactor unit can be removed and replaced upon failure or discovery of a defect in any one particular contactor unit, for example.

An example of the device of the present invention can be readily used for partial to full wafer-level testing of devices which have spring contact elements mounted thereto. In use, the segmented contactor including the backing substrate with plurality of contactor units mounted thereto and having conductive leads extending therefrom (the leads being connected to external testing equipment) is urged toward the wafer under test so that the resilient contact elements extending from the devices on the wafer make contact with corresponding conductive areas or pads on corresponding contactor units of the segmented contactor. The ability of all the resilient contacts to make contact with the plurality of contactor units, all at once, can facilitate such processes as wafer-level burn-in or testing. However, it is not necessary that every die on the wafer contact a corresponding contactor unit on the segmented contactor at once.

An alternative example of the present invention includes a segmented contactor which includes spring contact elements mounted to the contactor units of the segmented contactor.

It will also be appreciated that a segmented contactor of the invention may be used, after assembly, to test devices other than a semiconductor wafer, such as another contactor or a printed circuit board.

BRIEF DESCRIPTION OF THE DRAWINGS

The present invention is illustrated by way of example and not limitation in the figures of the accompanying drawings, in which like references indicate similar elements and in which:

FIG. 12 is a top plan view of a contactor unit showing a plurality of conductive areas on the top side of the contactor unit;

FIG. 13 is a cross sectional view of the contactor unit taken along line 13-13 of FIG. 12;

FIG. 14 is a bottom plan view of the contactor unit of FIG. 12 showing conductive areas on the bottom side of the contactor unit;

FIG. 15 is an enlarged partial cross sectional view of the contactor unit of FIG. 13;

FIG. 16 is a top plan view of a backing substrate of the present invention;

DETAILED DESCRIPTION

An improved large area multi-element contactor and method of fabricating the contactor is described. In the following description numerous specific details are set forth, such as specific equipment and materials, etc., in order to provide a thorough understanding of the present invention. It will be obvious, however, to one skilled in the art that the present invention may be practiced without these specific details. In other instances, well-known machines and methods for making such machines have not been described in particular detail in order to avoid unnecessarily obscuring the present invention.

Figure 1:
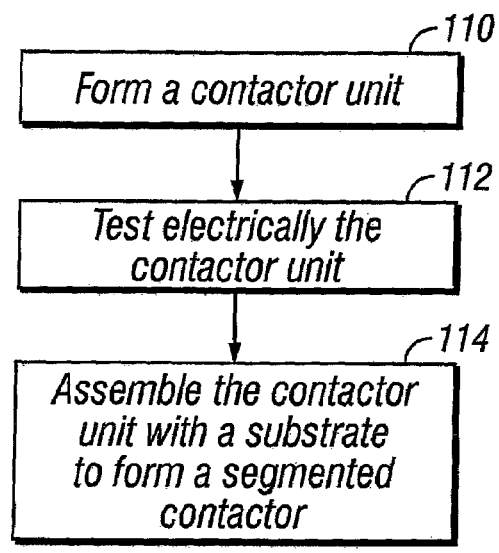
FIG. 1 is a flowchart of a method performed in accordance with the present invention.

FIG. 1 illustrates a method of fabricating a segmented contactor comprising forming a contactor unit (110), testing electrically the contactor unit (112), and assembling the contactor unit which has passed the electrical testing with a substrate to form the segmented contactor (114). The method shown in FIG. 1 can include forming a plurality of contactor units and assembling the plurality of tested contactor units with a substrate to form the segmented contactor. When a plurality of contactor units is formed, each of the contactor units is preferably tested before assembling to the substrate to form the segmented contactor. Alternatively, the testing can be performed after assembling. In another example of the method of fabricating a segmented contactor, the contactor unit (or units) can be retested after assembling the contactor unit with a substrate.

The method of FIG. 1 can include, as a precursor, forming the contactor unit from a single contactor substrate. For example, a tile can be formed on the single contactor substrate. The tile is the body of the contactor unit and may include conductive areas on at least one side. The tile may also include runners or conductive pathways within the tile. The tile can be made from a layered substrate, for example, with the runners disposed within or through selected layers.

The tile can be tested electrically either before or after being separated from the contactor substrate. Preferably, the testing is performed before the tile is used in a testing assembly such as a segmented contactor.

The method shown in FIG. 1 can further include testing a device on a wafer with the segmented contactor. For example, a wafer can include a plurality of semiconductor devices, such as integrated circuits. The segmented contactor can be used to test some or all of the devices on the wafer. Techniques for performing wafer-level burn-in and test of semiconductor devices are described in commonly assigned, copending, U.S. patent application Ser. No. 08/784,862, entitled "Wafer-Level Burn-In and Test," filed Jan. 15, 1997, incorporated by reference herein.

Figure 2:
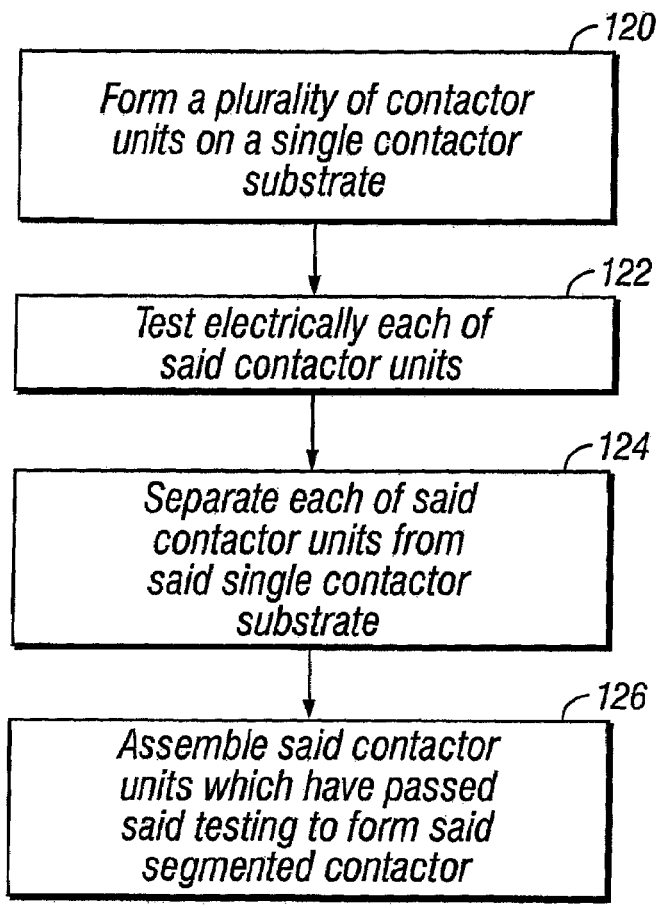
FIG. 2 is a flowchart of another method performed in accordance with the present invention.

FIG. 2 illustrates another method of fabricating a segmented contactor. An example of the method shown in FIG. 2 comprises forming a plurality of contactor units on a single contactor substrate (120), testing electrically each of the contactor units (122), separating each of the contactor units from the single contactor substrate (124), and assembling the contactor units which have passed the testing to form the segmented contactor (126). Forming the plurality of the contactor units (120), however, need not be accomplished on a single contactor substrate. For example, the contactor units can be formed individually.

The testing (122) of the contactor units can be performed either before or after separating (124) each contactor unit from the single contactor substrate. Another example of the method includes testing (122) the contactor units after they are assembled (126) to the substrate to form the segmented contactor. The method can also include retesting of the contactor units once they are assembled after having been previously tested before assembly to form the segmented contactor.

The method of fabricating a segmented contactor for testing multiple devices on a wafer can also include connecting at least one of the contactor units that have been assembled on the substrate with another one of the contactor units on the substrate. This electrical connection can be accomplished with discrete wires or through flexible strips which include a plurality of conductive leads, for example. The wires or flexible strips can be soldered or otherwise suitably connected between two or more contactor units. The electrical connection between contactor units can also be accomplished with connectors on corresponding edges of adjacent contactor units. Alternatively, contactor units can be electrically connected to each other through conductive pathways formed in the backing substrate, which conductive pathways terminate at conductive pads or vias on the surface of the substrate. The conductive paths or vias can be aligned with corresponding conductive areas on separate contactor units that are to be electrically connected. The contactor units and the conductive pathways of the backing substrate can thus be electrically connected with a suitable means of connecting, such as wiring or solder.

Connecting multiple contactor units together on a segmented contactor can be advantageous when the segmented contactor is designed for testing a plurality of semiconductor devices on a single wafer. For example, although there can be a one to one correspondence between contactor units of the segmented contactor and devices on the wafer, each separate contactor unit can be sized and designed to test a plurality of devices on the wafer. For example, to test a wafer having 400 devices (DUTs), a segmented contactor can be provided that has 8 contactor units, each of which can accommodate 50 DUTs.

Another example of the method shown in FIG. 2 can further include attaching a plurality of electrically conductive leads to at least one of the plurality of contactor units. Preferably, the leads extend beyond the edge of a corresponding contactor unit, and a connector is provided on the leads for connecting the leads to an external testing device, for example to a burn-in board, which in turn may be connected to other test equipment.

Figure 3:
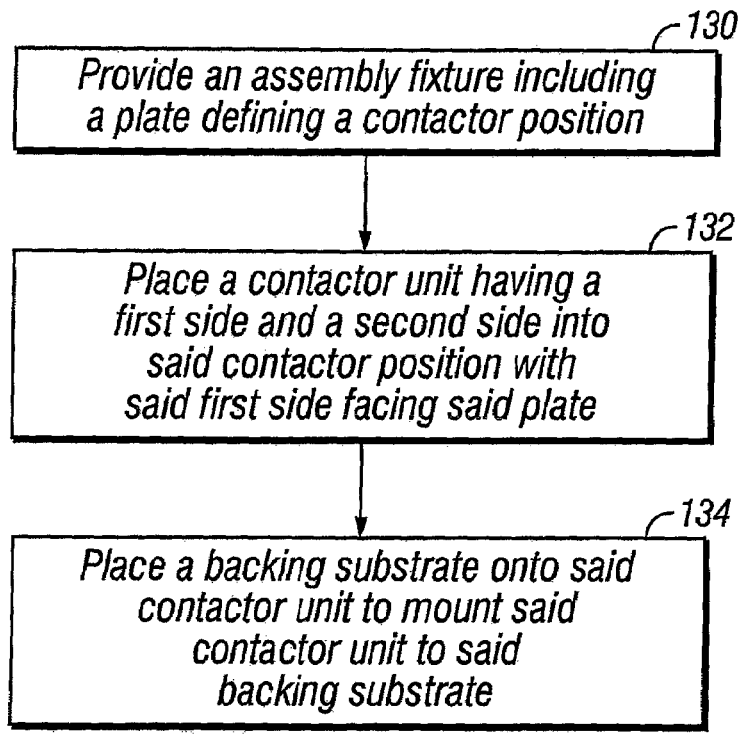
FIG. 3 is a flowchart of another method performed in accordance with the present invention.

FIG. 3 shows a method of assembling a segmented contactor comprising providing an assembly fixture including a plate that defines a contactor position (130), placing a contactor unit into the contactor position (132), and placing a backing substrate over the contactor unit in order to mount the contactor unit to the backing substrate (134).

An example of the plate preferably defines a plurality of contactor positions that are holding spaces into which can be placed corresponding ones of a plurality of contactor units. The holding spaces are defined in the plate such that boundaries are defined for the individual contactor units which are placed into the holding spaces. The assembly fixture of the example of the method of FIG. 3 can provide a selected configuration of contactor positions so that the contactor units can be arranged to match corresponding dies or devices as they are laid out on a semiconductor wafer. The assembly fixture preferably holds the contactor units in near final position as accurately as possible.

In one preferred implementation following the method of FIG. 3, a plate is provided in which grooves are defined. The method can further comprise inserting guide blocks into the grooves to define the holding spaces or boundaries between the guide blocks. The contactor unit has a first side and a second side. The first side preferably faces the plate when the contactor unit is placed into the holding space.

The method can also further include providing a securing mechanism such as an adhesive on the second side of the contactor unit for securing or mounting the contactor unit to the backing substrate. The method can include affixing the adhesive to the contactor unit before the contactor unit is placed into the assembly fixture. Alternatively, the adhesive can be affixed to the backing substrate before the backing substrate is placed over the contactor unit that has been inserted into the holding space of the assembly fixture. Another alternative is to place the adhesive onto the contactor unit after the contactor unit has been placed into the holding space of the assembly fixture.

The method shown in FIG. 3 can further include testing of the contactor unit. The testing can be performed before or after placing the contactor unit into the holding space of the assembly fixture. The method can further include retesting the contactor unit after placing the backing substrate onto the contactor unit.

Figure 4:
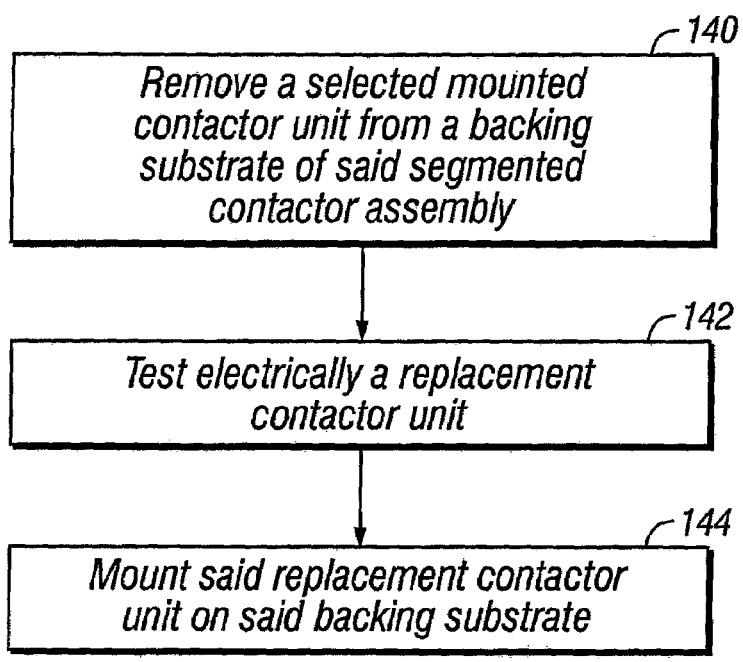
FIG. 4 is a flowchart of another method performed in accordance with the present invention.

FIG. 4 shows a method of repairing a segmented contactor assembly comprising removing a selected mounted contactor unit from a backing substrate of the segmented contactor assembly (140), testing electrically a replacement contactor unit (142), and mounting the replacement contactor unit of the backing substrate (144). The exemplary method of FIG. 4 can be implemented in a variety of sequences. For example, the mounted contactor unit can be tested (142) to determine whether it is defective, for example, prior to being removed (140) from the backing substrate. Alternatively, a known "bad" contactor unit can be removed from the backing substrate and replaced with a new contactor unit without testing the bad contactor unit. The new contactor unit can be tested (142) either before or after being mounted (144) to the backing substrate. Yet another alternative scenario can include repair of the contactor unit which has been removed (140) from the backing substrate. In this case, the bad contactor unit can be removed (140) from the backing substrate, tested (142), repaired if necessary, and then replaced (144) onto the backing substrate. The method illustrated in FIG. 4 can also be implemented when it is desired to change a contactor unit that may not necessarily be defective. For example, it may be desirable to change a particular configuration of contactor units to accommodate a change in the semiconductor dies or devices being tested on the wafer.

Figure 5:
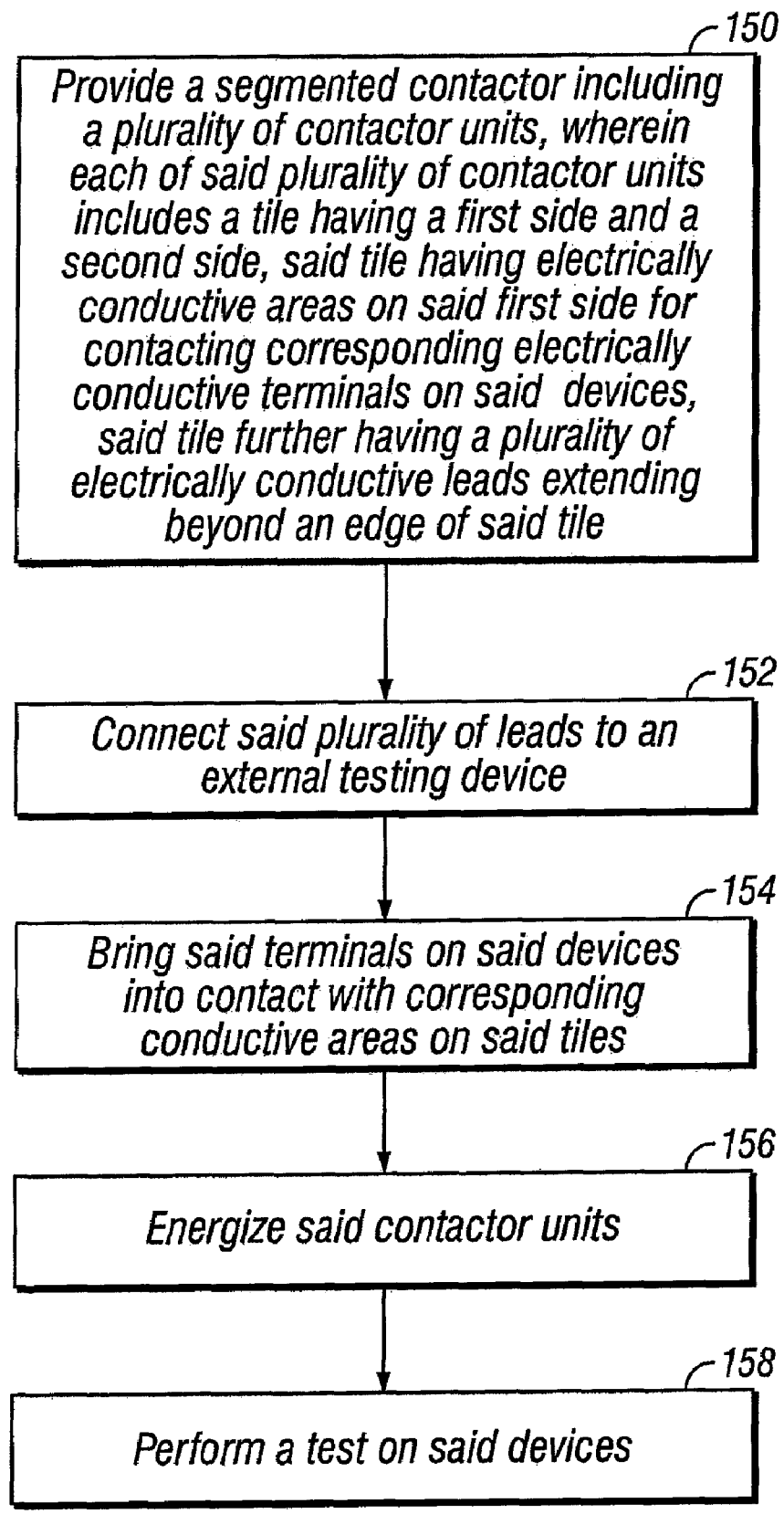
FIG. 5 is a flowchart of another method performed in accordance with the present invention.

FIG. 5 shows a method of testing a plurality of devices on a wafer comprising providing a segmented contactor (150) as previously described. The segmented contactor provided in the example of FIG. 5 preferably includes a tile having a first side and a second side wherein the tile has electrically conductive areas on the first side for contacting corresponding electrically conductive terminals on the device or devices of the wafer under test. The tile further preferably has a plurality of electrically conductive leads extending beyond edge of the tile. The method further comprises connecting the plurality of leads extending from the tile to an external testing instrument or device, bringing the terminals on the devices under test into contact with corresponding conductive areas on the tiles, energizing the contactor units, and performing a test on the devices.

Figure 6:
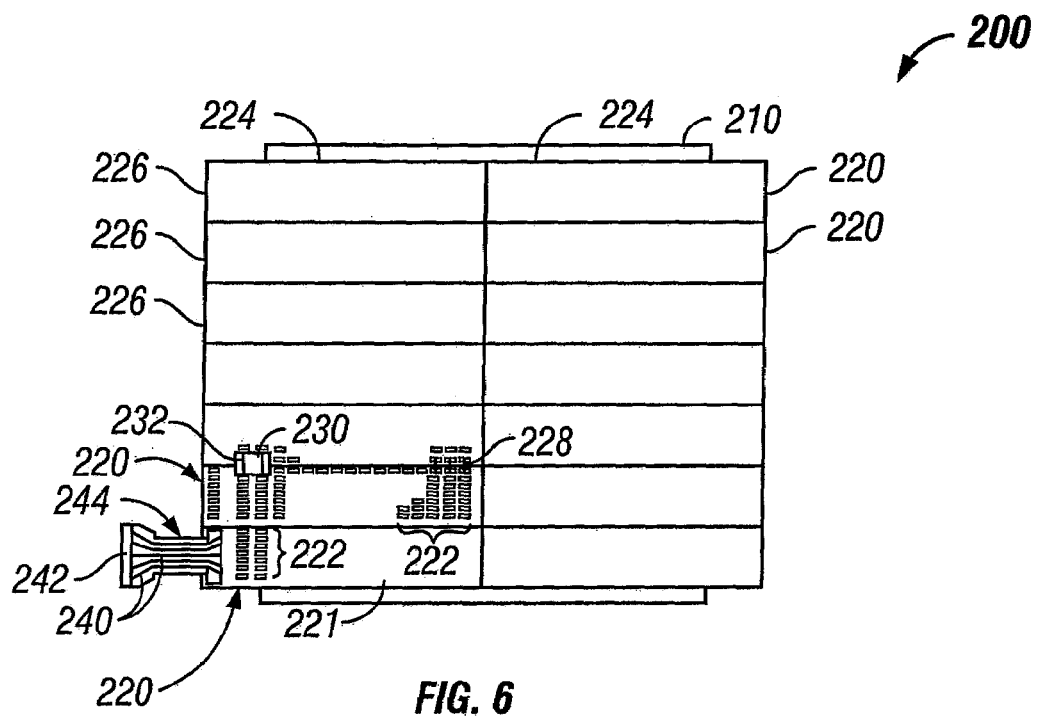
FIG. 6 is a top plan view of a segmented contactor in accordance with the present invention.

An electrical testing assembly 200 such as a segmented contactor for testing a device on a semiconductor wafer, is shown in FIG. 6. The electrical testing assembly includes a substrate 210, a plurality of contactor units 220 assembled with the substrate 210, and a plurality of electrically conductive areas 222 arranged on each of the contactor units 220. For simplicity of illustration, only a few of the plurality of conductive areas 222 on the contactor units 220 are shown in FIG. 6.

The contactor units 220 preferably have each been tested electrically prior to being assembled with the substrate 210 to form the segmented contactor 200. Also, the conductive areas 222 on each of the contactor units 220 are configured to be electrically connected to the device under test (not shown).

As shown in FIG. 6, the substrate 210 is a rectangular piece on which is mounted a plurality of generally rectangular contactor units 220 that are arranged in two columns 224 and multiple rows 226. The arrangement or configuration of the contactor units 220 on the substrate 210 can, however, be any desired shape, size, or arrangement as may be required for the particular devices and wafer being tested by the segmented contactor 200.

The electrically conductive areas 222 on each contactor unit 220 can also be arranged or configured in any desired arrangement as necessary to match corresponding electrically conductive terminals on the wafer that will be tested with the segmented contactor 200. The electrically conductive areas 222 of the contactor units 220 are preferably conductive pads, but alternatively can include other contact elements such as solder balls, points, and the like. Particularly preferred are extended freestanding resilient contact elements.

As further shown in FIG. 6, the contactor units 220 can be electrically connected to each other by wire bond connections 228 or by a flexible strip 230 that includes a plurality of conductive leads 232.

The segmented contactor 200 shown in FIG. 6 can also include a plurality of electrically conductive leads 240 extending from at least one (shown in FIG. 6) and preferably from each of the contactor units 220. The electrically conductive leads 240 are preferably configured for connection to an external instrument (not shown). For example, a connector 242 can be provided on the free ends of the leads 240. The leads 240 are preferably attached to the contactor unit 220 and correspond to selected ones of the plurality of electrically conductive areas 222 on the contactor unit 220. The leads 240 are preferably carried in a flexible strip 244. A plurality of flexible strips 244 can be provided and attached to one contactor unit 220. The flexible strip 244 can be secured to the contactor unit 220 on either the first side 221 or the second side (not shown) of the contactor unit 230.

Figure 7:
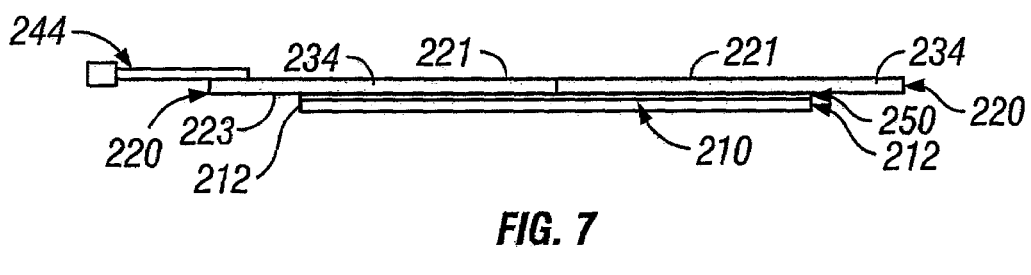
FIG. 7 is a front elevational view of the segmented contactor of FIG. 6.

FIG. 7 shows the contactor units 220 extending partially over the edge 212 of the backing substrate 210. The extending portion 234 of the contactor units 220 provides an area that is available to secure a flexible strip 244 or a plurality of flexible strips 244 to either the first 221 or second sides 223 or both sides of the contactor unit 220.

As shown in FIG. 7, the contactor units 220 are secured to the backing substrate 210 with a securing mechanism such as an adhesive 250, for example. Any suitable securing means can be used to accomplish the mounting of the contactor units 220 to the backing substrate 210; however, an adhesive that is relatively thin, durable and that can withstand high temperatures is preferable. The adhesive 250 can be such that the contactor units 220 are either relatively securely or removably mounted to the substrate 210. Alternatively, the contactor units 220 can be mounted to the backing substrate 210 with a conductive material in place of the adhesive 250. The conductive material can be electrically conductive and/or thermally conductive.

FIG. 7 also shows that the first sides 221 of the contactor units 220 are preferably coplanar with each other when mounted onto the backing substrate 210. The coplanarity of the contactor units 220 of the segmented contactor 200 is desirable to provide a better electrical connection between the resilient contact elements or conductive terminals of the wafer under test over the entire surface of the segmented contactor 200.

Figure 8:
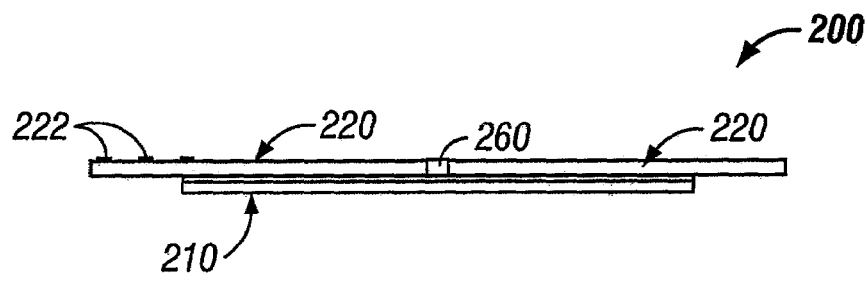
FIG. 8 is a front elevational view of another embodiment of the segmented contactor of the present invention.

FIG. 8 shows a segmented contactor 200 that includes a backing substrate 210 and contactor units 220 mounted to the backing substrate 210. Also, an alignment mechanism 260 such as a rail or block can be provided between contactor units 220. Preferably, the alignment mechanism does not extend significantly higher than the surface of the contactor units 220.

Preferably, the backing substrate 210 and the contactor units 220 or tiles are made of silicon. It is preferable that the backing substrate 210 and contactor units 220 have a similar coefficient of thermal expansion relative to each other and to the wafer under test. Providing materials having similar coefficient of thermal expansion among all the pieces of the segmented contactor and the wafer under test is advantageous because the heat generated during testing procedures can cause thermal expansion of the parts. Due to the enormous number of connections and extremely tight tolerances that must be maintained between conductive areas and between each terminal on the wafer, any amount of expansion due to heat can potentially cause misalignment of the conductive areas 222 on the contactor units 220 and the conductive terminals of the wafer under test. Therefore, if all the materials have a substantially similar coefficient of thermal expansion, the effect of thermal expansion on the dimensions of the parts can be minimized. Also, because the segmented contactor 200 is preferably comprised of a plurality of contactor units 220 rather than a single contactor unit substrate, the effect of thermal expansion on each contactor unit 220 is not as great as the same amount of expansion over a longer span of material. Thus, the effect of thermal expansion on the tolerance stack-up is minimized.

An example of a material that can be used to construct the substrate of the contactor unit is silicon. An alternative material that can be used is glass or a material including silicon dioxide ($SiO_2$). It is contemplated that the contactor units 220 can be made of a flexible material such as UPILEX™ material. Also, the contactor units 220 can potentially be made of an organic material such as that which is commonly used as the base material of printed circuit boards.

Figure 9:
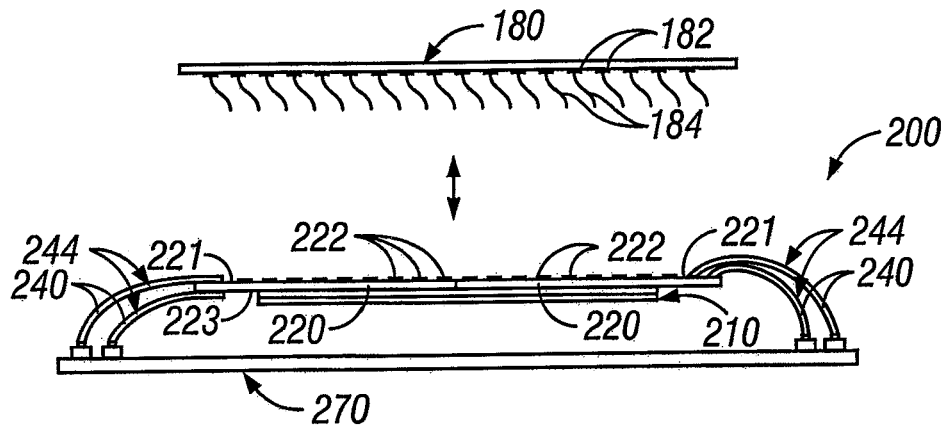
FIG. 9 is a front elevational view of the segmented contactor of the present invention with a wafer including resilient contact elements mounted on the wafer.
Figure 10:
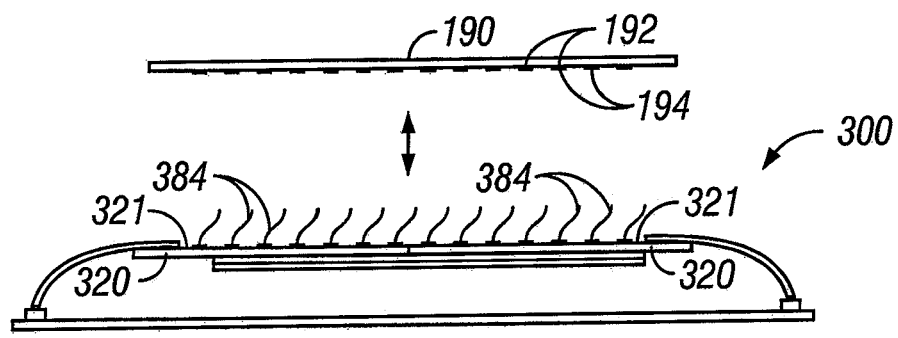
FIG. 10 is a front elevational view of the segmented contactor of the present invention including resilient contact elements mounted on contactor units of the segmented contactor.

FIGS. 9 and 10 show examples of segmented contactors used for testing wafers that include semiconductor devices such as integrated circuits. Referring to FIG. 9, a segmented contactor 200 is shown attached to an external instrument 270 such as a testing device or a burn-in board. The contactor units 220 of FIG. 9 include electrically conductive areas 222 on their top or first sides 221. The electrically conductive areas 222 in the example of FIG. 9 are configured as electrically conductive pads. Backing substrate 210 is shown below the contactor units 220 in the exemplary configuration of FIG. 9. Leads 240 are shown extending from the contactor units 220 and connected to the external instrument 270. As shown in FIG. 9, the leads 240 can extend from either the first side 221 or the second side 223 of the contactor units 220. Also, the leads 240 can be configured in groups such as those carried in flexible strips 244. Such grouped leads 240 or flexible strips 244 can extend from one side of the contactor units 220 but can be attached in a staggered fashion or an overlapping fashion as shown in FIG. 9.

The wafer under test 180 in the example of FIG. 9, includes electrically conductive terminals 182 that are resilient contact elements 184, for example. The wafer 180 is positioned above the segmented contactor 200 such that the resilient contact elements 184 face the first side 221 of the contactor units 220 and are aligned with the electrically conductive areas 222 on the contactor units 220. The wafer 180 is securely held and accurately positioned by any of a variety of techniques. See, for example, U.S. patent application Ser. No. 08/784,862 (generally). To accomplish the test, the wafer 180 and the segmented contactor 200 are urged toward each other so that the resilient contact elements 184 come into physical contact with the electrically conductive areas 222 on the segmented contactor 220. Preferably, the resilient contact elements 184 are configured such that when a force is applied perpendicularly to the wafer 180, the resilient contact elements 184 exhibit slight movement laterally such that a scrubbing action can occur on the electrically conductive areas 222. The scrubbing (or siping) action serves to provide a better electrical contact by scraping away oxidation or contamination that may be accumulated on the electrically conductive areas 222.

Once the wafer under test 180 and the segmented contactor 200 are in contact, electrical power and signals can be provided from the burn-in board or external instrument 270 through the leads 240 to test or exercise the devices such as the integrated circuits on the wafer 180. This testing procedure can be accomplished within a testing chamber (not shown) so that the atmosphere and temperature can be controlled, for example.

FIG. 10 illustrates an alternative embodiment of the segmented contactor 300 wherein resilient contact elements 384 are mounted to the first side 321 of the contactor units 320. The wafer under test 190 in the example of FIG. 10 includes conductive terminals 192 such as pads 194 that are aligned with the resilient contact elements 384 of the contactor units 320. The wafer 190 and the segmented contactor 300 are urged toward each other, similarly to the configuration of FIG. 9, to accomplish testing or wafer exercise procedures.

It will be appreciated that a segmented contactor of the invention may be used to test devices other than a semiconductor wafer, such as another contactor or a printed circuit board.

Figure 11:
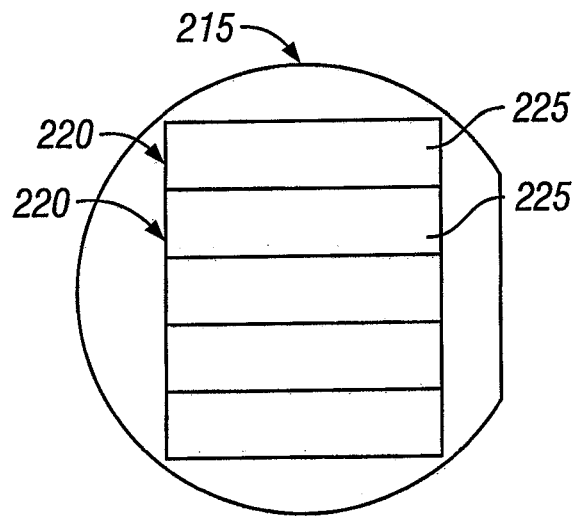
FIG. 11 is a top plan view of a substrate on which contactor units are formed in accordance with the present invention.

FIGS. 11 through 15 show an example of a contactor unit 220. As shown in FIG. 11, a contactor substrate 215 can be provided on which a plurality of contactor units 220 can be formed. The contactor substrate 215 can be monolithic. The contactor units 220 preferably comprise tiles 225 that are defined or formed on the larger contactor substrate 215. It is not necessary, however, to form a plurality of contactor units 220 on a large contactor substrate 215. Alternatively, contactor units 220 can be formed individually. The contactor substrate 215 can preferably be a semiconductor wafer or similar substrate.

FIG. 12 shows an example of a contactor unit 220 that comprises a tile 225 having electrically conductive areas 222 on its first side 221. For simplicity of illustration, electrically conductive areas 222 are only partially shown on FIG. 12. The electrically conductive areas 222 are preferably disposed over most of the first side 221, but can be arranged in any desirable configuration for a particular contactor unit 220.

FIG. 13 shows the contactor unit 220 including leads 240 attached to electrically conductive areas 222 on the first side 221 and the second side 223 of the tile 225. The leads 240 are shown overlapping and including connectors 242 on the free ends of the leads 240. As previously described, leads 240 can be carried in flexible strips 244 or can be discrete wires. Alternatively, an edge connector (not shown) can be provided in place of leads 240. The edge connector can be configured to accept a jumper wire or cable for connection to the external instrument, or the edge connector can be directly connected to an external instrument.

FIG. 14 shows a contactor unit 220 having electrically conducive areas 222 on its second side 223. It is not necessary, however, to provide electrically conductive areas 222 on the second side 223 of the contactor unit 220.

FIG. 15 shows an example of a contactor unit 220 that has electrically conductive areas 222 on both the first side 221 and the second side 223 of the tile 225. An example of a contactor unit 220 having conductive areas 222 on both sides can be an interposer. The electrically conductive areas 222 on both sides of the tile 225 can be connected by conductive pathways 227 through the tile 225. The conductive pathways 227 need not be formed vertically or directly through the tile 225, but can extend laterally along the length of the tile 225 so as to connect electrically conductive areas 222 on both sides or on the same side of the tile 225 that are not directly opposed from each other.

FIG. 15 also shows the backing substrate 210 mounted to the contactor unit 220 with an example of conductive material 252. As shown in FIG. 15, the conductive material 252 can comprise individual pieces that are associated with corresponding electrically conductive areas 222 on the surface of the contactor unit 220. For example, the conductive material 252 can be discrete amounts of solder.

Also shown in FIG. 15 is the backing substrate 210 having electrically conductive runners 217 such as those found in a multi-layer printed circuit board (PCB). The conductive material 252 provides a connection between the conductive pathways 227 and the electrically conductive areas 222 on the contactor unit 220 to electrically conductive areas or pathways 217 on the backing substrate 210.

FIG. 16 shows an example of a backing substrate 210 on which a plurality of contactor units can be mounted. The backing substrate 210 is preferably made of the same material as the tiles of the contactor units, however, it can alternatively made of PCB material or glass. The example of the backing substrate shown in FIG. 16 is generally a square shaped piece, but any suitable shape or size can be provided for a particular application. For example, the backing substrate can be a rectangle 8 inches wide by 8.25 inches long.

Figure 17:
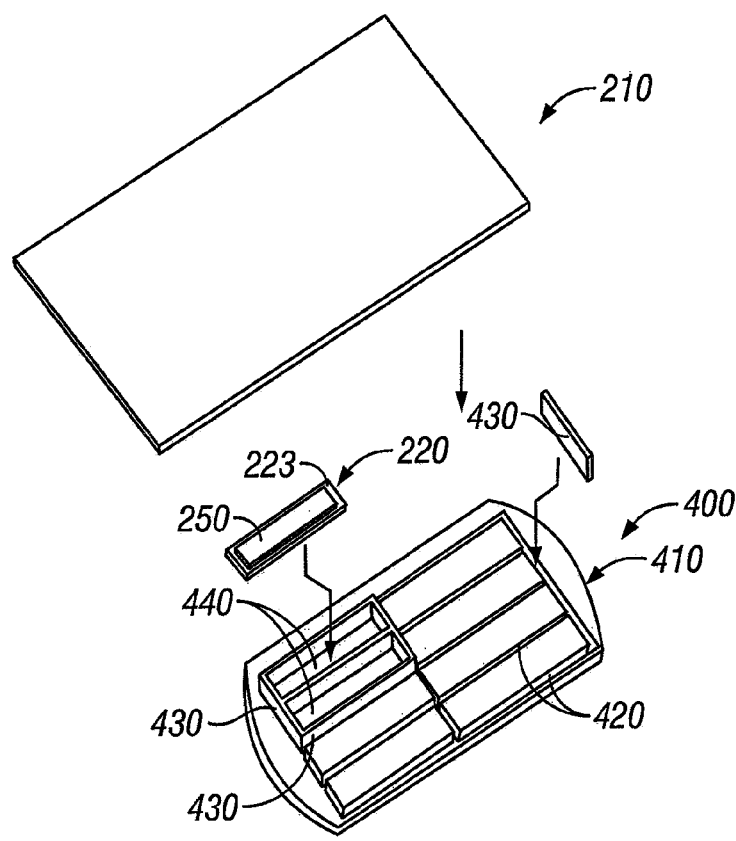
FIG. 17 is a perspective view of an assembly fixture in accordance with the present invention.

FIG. 17 shows an example of an assembly fixture 400 that can be used to assemble a segmented contactor of the present invention. Assembly fixture 400 includes a plate 410 that is a generally flat piece of material having moderate thickness. The plate 410 can be any suitable shape that will accommodate the desired or selected configuration of contactor units 220. One example of a plate 410 defines grooves 420 that preferably have been cut into plate 410 using a wafer saw, for example. The grooves 420 are of a selected depth and width such that they accommodate guide blocks 430. The grooves 420 are cut into the plate 410 in a configuration such that when the guide blocks 430 are placed into the grooves 420, contactor positions 440 are defined within the boundaries defined by the guide blocks 430. In the example shown in FIG. 17, contactor positions 440 are the areas or spaces within the boundaries defined by guide blocks 430. Contactor positions 440 can also be referred to as holding spaces.

While FIG. 17 shows one example of a plate that defines contactor positions, other examples can be contemplated. For example, the plate can define holes or sockets into which a key or protrusion on the tile or contactor unit can fit.

As further shown in FIG. 17, during assembly of the segmented contactor, a contactor unit 220 is placed within a corresponding contactor position 440 defined on the plate 410 of the assembly fixture 400. The contactor unit 220 may already include an adhesive 250 or other securing mechanism on the second side 223 of the contactor unit 220. The contactor unit 220 is placed into the contactor position 440 with the adhesive 250, if applied, facing up. The backing substrate 210 can then be pressed or placed onto the adhesive 250 in order to mount the contactor unit 220 to the backing substrate 210.

Preferably, the adhesive is cured after the backing substrate 210 is pressed onto the adhesive 250 of the contactor unit 220. One way to accomplish curing is to expose the parts to relatively higher temperatures. Also, pressure can be applied to the backing substrate 210 in order to effect curing and proper adhesion. An example of an adhesive is a thermal set epoxy such as, for example, TORRAY™ T-61 epoxy. For example, the assembled parts can be baked at approximately 150° C. for approximately 45 minutes while the backing substrate 210 is applied to the contactor unit 220 under pressure of approximately 15 psi. The pressure is then released, and the flatness of the contactor units can be measured. This laminating assembly procedure results in a high degree of coplanarity among the contactor units 220; preferably less than about 0.3-0.4 mm.

Figure 18:
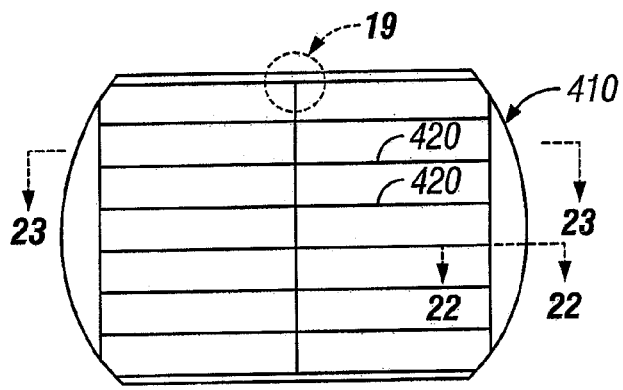
FIG. 18 is a top plan view of a plate defining grooves of the assembly fixture.

FIG. 18 shows an example of a plate 410 that can be used for an assembly fixture 400 including grooves 420 defined therein. Grooves 420 are preferably about 4 to 5 mils wide, for example.

Figure 19:
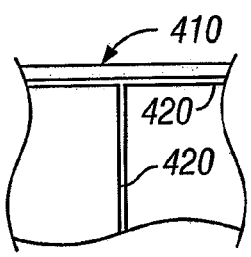
FIG. 19 is an enlarged partial plan view of a portion of the plate of FIG. 18.

FIG. 19 shows an example of the grooves 420 that have been cut into the plate 410.

Figure 20:
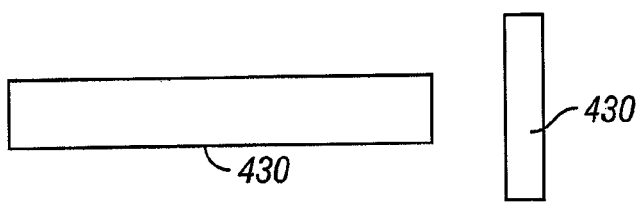
FIG. 20 is a side elevational view of a guide block in accordance with the present invention.
Figure 21:
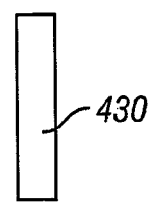
FIG. 21 is an end view of the guide block of FIG. 20.

FIGS. 20 and 21 show an example of a guide block 430 that can be inserted into the grooves of the plate of FIGS. 18 and 19. The guide blocks 430 are preferably dimensioned for a snug fit within the grooves of the plate. The guide block 430 is preferably made of a polyamide material such as, for example, KAPTON™ or UPILEX™ materials.

Figure 22:
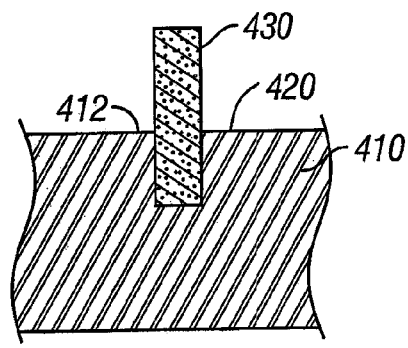
FIG. 22 is an enlarged partial sectional view of the plate of FIG. 18 taken along line 22-22 of FIG. 18 and showing a guide block inserted in a groove defined in the plate of FIG. 18.

FIG. 22 shows a guide block 430 inserted into a groove 420 of a plate 410 and extending upwardly beyond the surface 412 of the plate 410.

Figure 23:
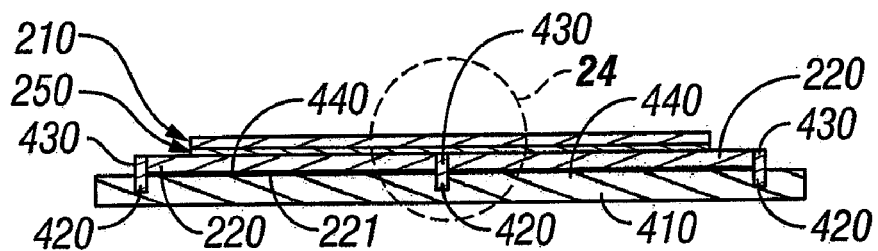
FIG. 23 is a cross sectional view taken along line 23-23 of FIG. 18 of an assembly fixture holding contactor units and a backing substrate in accordance with the present invention.

FIG. 23 shows a cross section of a plate 410 having guide blocks 430 inserted into grooves 420 that have been cut into the plate 410. The guide blocks 430 define contactor positions 440 between adjacent guide blocks 430. The guide blocks and the contactor positions are preferably dimensioned to take into account tolerances and to allow a release of the contactor units from the assembly fixture. A plurality of contactor units 220 is shown placed between the guide blocks 430 and in the contactor positions 440. An adhesive 250 is shown placed on top of the contactor units 220. A backing substrate 210 is shown placed on top of the adhesive 250.

Figure 24:
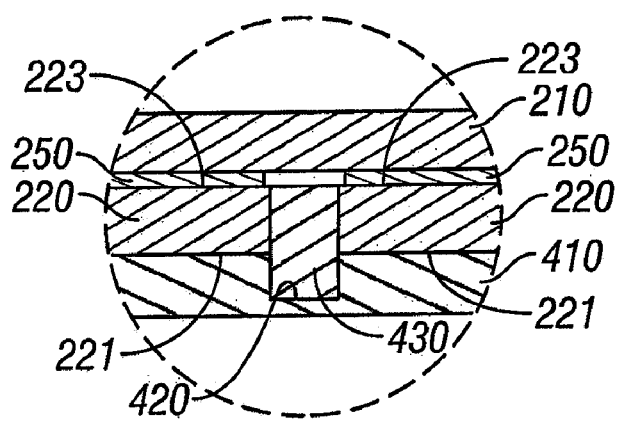
FIG. 24 is an enlarged partial cross sectional view of the assembly fixture of FIG. 23.

FIG. 24 also illustrates the plate 410 including a groove 420 into which a guide block 430 has been inserted. The guide block 430 extends above the surface 412 of the plate 410 so that contactor units 220 can be placed between adjacent guide blocks 430. An adhesive 250 is shown placed on top of contactor units 220. Preferably the adhesive 250 is placed on the second side 223 of the contactor unit 220. The first side 221 of the contactor unit 220 is preferably placed into the assembly fixture 400 facing the plate 410. A backing substrate 210 is shown on top of the adhesive 250.

Figure 25:
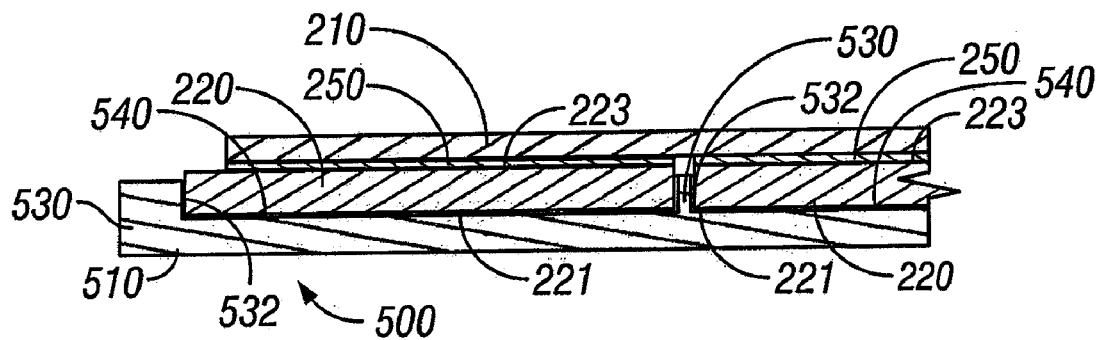
FIG. 25 is an enlarged partial cross sectional view of another embodiment of an assembly fixture in accordance with the present invention.

FIG. 25 shows an alternate embodiment plate of an assembly fixture 500 including a plate 510 that defines contactor positions 540. In the example of the assembly fixture 500 of FIG. 25, the contactor positions 540 can be defined by removing material from the plate 510 and leaving upwardly extending walls 530. In this case, pockets 532 are formed into the plate 510 in which the contactor units 210 are then placed. The first side 221 of the contactor unit 220 is similarly placed facing downwardly toward the plate 510, while the second side 223 of the contactor unit 220 faces up. An adhesive 250 can be applied to the contactor unit 220, and a backing substrate 210 can then be pressed onto the adhesive 250 using the techniques previously described.

Thus, a segmented contactor has been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

The invention claimed is:

1. A method of fabricating a segmented contactor for use in a testing assembly, said method comprising:
    forming a plurality of contactor unit tiles on a single substrate, each of said tiles comprising a first side to which a plurality of freestanding, resilient contact elements are attached, each of said tiles further comprising a second side opposite said first side;
    separating each of said tiles from said single substrate; and
    testing electrically each of said tiles;
    attaching said second sides of ones of said tiles that pass said testing to a backing substrate, wherein said attaching comprises disposing said ones of said tiles on said backing substrate such that said first sides of said ones of said tiles are generally coplanar and contact tips of said resilient contact elements attached to said first sides of said ones of said tiles are disposed in a pattern generally in a plane that corresponds to terminals of said integrated circuits.

2. The method of claim 1 wherein said testing is performed prior to use of said ones of said tiles in said testing assembly.

3. The method of claim 1 wherein said testing is performed before said ones of said tiles are assembled in said testing assembly.

4. The method of claim 1 further comprising:
    assembling said segmented contactor into said testing assembly; and
    retesting said ones of said tiles after said assembling.

5. The method of claim 1 wherein said single substrate is monolithic.

6. The method of claim 1, wherein said segmented contactor is usable to test integrated circuits on a wafer.

7. A method of fabricating a contactor unit for use in a testing assembly, said method comprising:
    forming at least one tile contactor unit on a single contactor substrate;
        separating said at least one tile from said substrate, wherein said tile has a first side and a second side and a plurality of conductive areas on said first side;
        testing electrically said at least one tile; and
        assembling a plurality of said tiles into a segmented contactor usable to test integrated circuits on a wafer, wherein said assembling comprises:
        placing the tiles into an assembly fixture having defined holding spaces;
        coupling a backing substrate to the tiles via a coupling means; and lifting the backing substrate away from the assembly fixture.

8. The method of claim 7 wherein said attaching comprises adhering with an adhesive said second sides of said ones of said tiles to said backing substrate.

9. A method of fabricating a contactor device for use in a testing assembly, said method comprising:
    forming on a single substrate a plurality of tile contactor units for use in said testing assembly, said tiles each having a first side and a second side wherein a plurality of freestanding, resilient contact elements are attached to said first side;
    testing electrically said tiles, wherein said tiles are tested tiles after said testing;
    separating said tested tiles from said substrate, wherein said tested tiles are separated tiles after said separating; and
    assembling ones of said separated tiles that passed said testing into a segmented contactor usable to test integrated circuits of an unsingulated semiconductor wafer, wherein said assembling comprises positioning said ones of said separated tiles with respect to each other such that said first sides of said ones of said separated tiles are generally coplanar and contact tips of said resilient contact elements on said first sides of said ones of said separated tiles are disposed in a pattern generally in a plane that corresponds to terminals of said integrated circuits of said unsingulated wafer.

10. The method of claim 9 wherein:
    said assembling comprises attaching said second sides of said ones of said separated tiles to a backing substrate, and
    said tiles and said backing substrate have similar coefficients of thermal expansion.

11. The method of claim 9 further comprising using said segmented contactor to test said integrated circuits of said unsingulated wafer.

12. A method of fabricating a contactor unit for use in a testing assembly, said method comprising:

forming a plurality of tile contactor units on a single substrate, said tiles each having a first side and a second side wherein said first side comprises a plurality of conductive areas;

testing electrically said tiles, wherein said tiles are tested tiles after said testing;

separating said tested tiles from said substrate, wherein said tested tiles are separated tiles after said separating; and assembling ones of said separated tiles that passed said testing into a segmented contactor usable to test integrated circuits of an unsingulated wafer, wherein said assembling comprises:

positioning said second sides of said ones of said separated tiles on a backing substrate with respect to each other such that said first sides of said ones of said separated tiles are generally coplanar and said conductive areas of said first sides of said ones of said separated tiles are disposed in a pattern generally in a plane that corresponds to contacts of said integrated circuits of said unsingulated wafer, and attaching said second sides of said ones of said separated tiles to said backing substrate.

13. The method of claim 12 wherein said tiles and backing substrate are made of a same material.

14. The method of claim 12 wherein said tiles and backing substrate are made of silicon.

* * * * *